(12) United States Patent
Varanasi et al.

(10) Patent No.: US 10,134,473 B1
(45) Date of Patent: Nov. 20, 2018

(54) INPUT OUTPUT SCHEDULING FOR SOLID STATE MEDIA

(71) Applicant: Vexata, Inc., Santa Clara, CA (US)

(72) Inventors: Surya P. Varanasi, Dublin, CA (US); Shailendra Jha, Folsom, CA (US)

(73) Assignee: Vexata, Inc., Santa Clara, CA (US)

( * ) Notice: Subject to any disclaimer, the term of this patent is extended or adjusted under 35 U.S.C. 154(b) by 0 days.

(21) Appl. No.: 15/159,703

(22) Filed: May 19, 2016

(51) Int. Cl.
  *G11C 16/26* (2006.01)
  *G11C 16/12* (2006.01)

(52) U.S. Cl.
  CPC ............. *G11C 16/12* (2013.01); *G11C 16/26* (2013.01)

(58) Field of Classification Search
  CPC .................................. G11C 16/12; G11C 16/26
  See application file for complete search history.

(56) References Cited

U.S. PATENT DOCUMENTS

| | | | |
|---|---|---|---|
| 5,996,031 A * | 11/1999 | Lim | G06F 13/385 710/20 |
| 7,865,761 B1 | 1/2011 | Chilton | |
| 8,661,187 B2 | 2/2014 | Hetzler | |
| 8,683,296 B2 | 3/2014 | Anderson | |
| 8,825,938 B1 | 9/2014 | Ellard et al. | |
| 9,032,165 B1 * | 5/2015 | Brooker | G06F 12/0806 711/154 |
| 9,722,632 B2 | 8/2017 | Anderson | |
| 2003/0061459 A1 * | 3/2003 | Aboulenein | G06F 12/0215 711/167 |
| 2006/0143336 A1 * | 6/2006 | Stroobach | G06F 9/4812 710/58 |
| 2010/0287333 A1 * | 11/2010 | Lee | G06F 12/0873 711/103 |
| 2012/0324178 A1 * | 12/2012 | Yoon | G11C 11/5628 711/154 |
| 2013/0191601 A1 * | 7/2013 | Peterson | G06F 12/0893 711/137 |
| 2016/0246518 A1 | 8/2016 | Galbraith | |
| 2017/0228158 A1 | 8/2017 | Kraemer | |
| 2017/0285972 A1 | 10/2017 | Dalmatov | |

* cited by examiner

*Primary Examiner* — Khamdan Alrobaie
(74) *Attorney, Agent, or Firm* — Pillsbury Winthrop Shaw Pittman LLP

(57) ABSTRACT

Described is a write scheduling scheme for a SSD that significantly increases read performance, in certain embodiments by about 50% compared to a conventional standard write scheduling schemes, for mixed read-write workloads while maintaining the write bandwidth.

13 Claims, 3 Drawing Sheets

INPUT OUTPUT SCHEDULING FOR SOLID STATE MEDIA

BACKGROUND

A flash solid state memory device ("SSD") typically achieves significantly higher write-only and read-only bandwidth when compared to the bandwidth observed for mixed read-write workloads.

Conventional input-output ("IO") scheduling schemes typically issue write commands to an SSD memory immediately upon receiving the request from an application layer. Further, writes tend to be randomly distributed over time. For example, an application writing at 200 MB/s with 128 KB block size would typically issue write IOs approximately separated by about 0.64 ms on average.

SUMMARY

Described is a write scheduling scheme for a SSD that significantly increases read performance, in certain embodiments by about 50% compared to a conventional standard write scheduling schemes, for mixed read-write workloads while maintaining the write bandwidth.

BRIEF DESCRIPTION OF THE DRAWINGS

These and other aspects and features will become apparent to those of ordinary skill in the art upon review of the following description of specific embodiments of the invention in conjunction with the accompanying figures, wherein.

DETAILED DESCRIPTION OF THE PREFERRED EMBODIMENT

Figure 1:
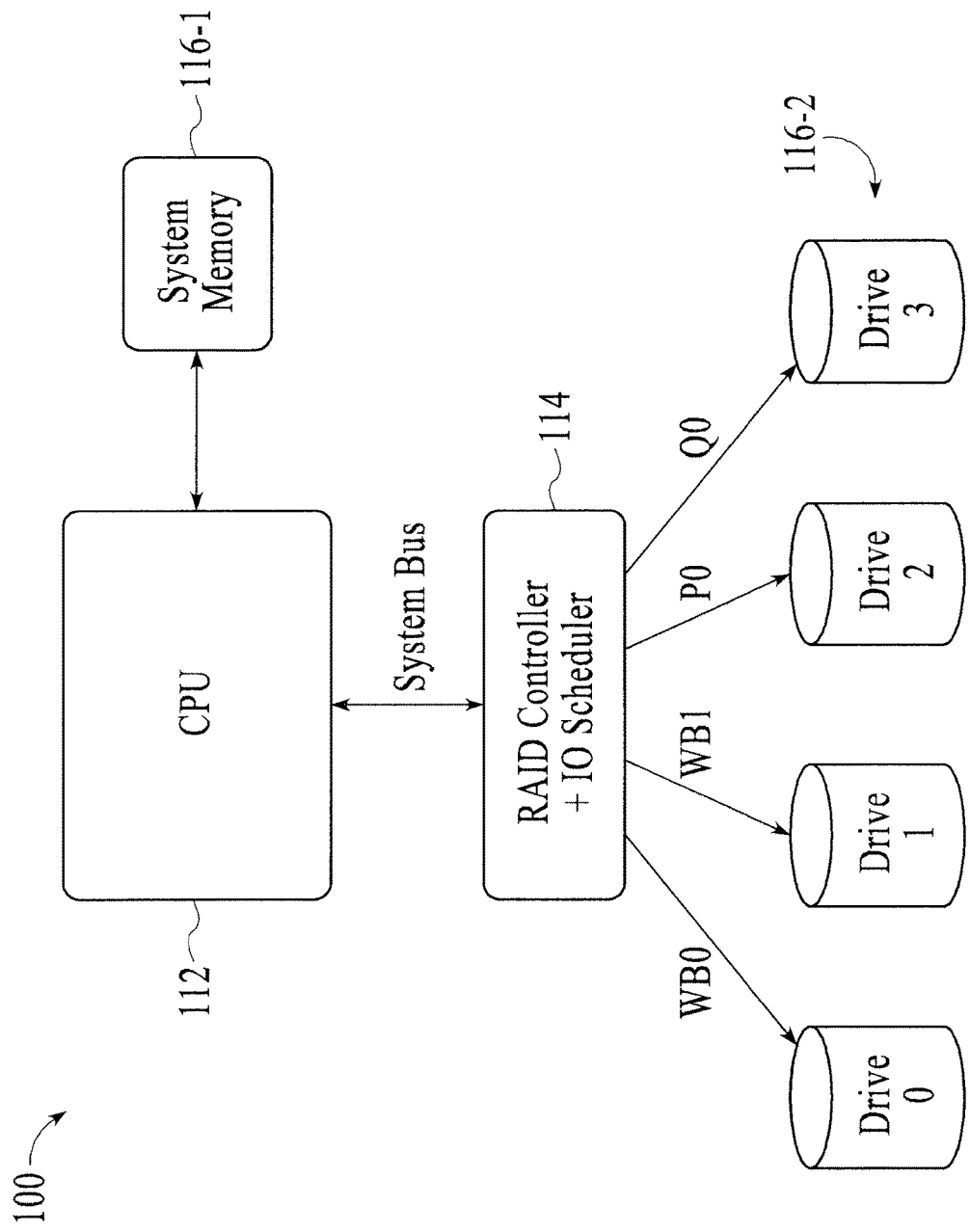
FIG. 1 illustrates an overview of a system that issues read and write commands to a solid state memory device.

As mentioned above, flash SSDs typically achieve significantly higher write-only and read-only bandwidth when compared to the bandwidth observed for mixed read-write workloads. Within the context of a mixed read-write workload, write commands and read commands are issued at different points in time. As illustrated in FIG. 1 a system 100 that includes conventional components such as a processor 112, controller 114, and memory 116, such as system memory 116-1, and SSD memory 116-2.

Figure 2:
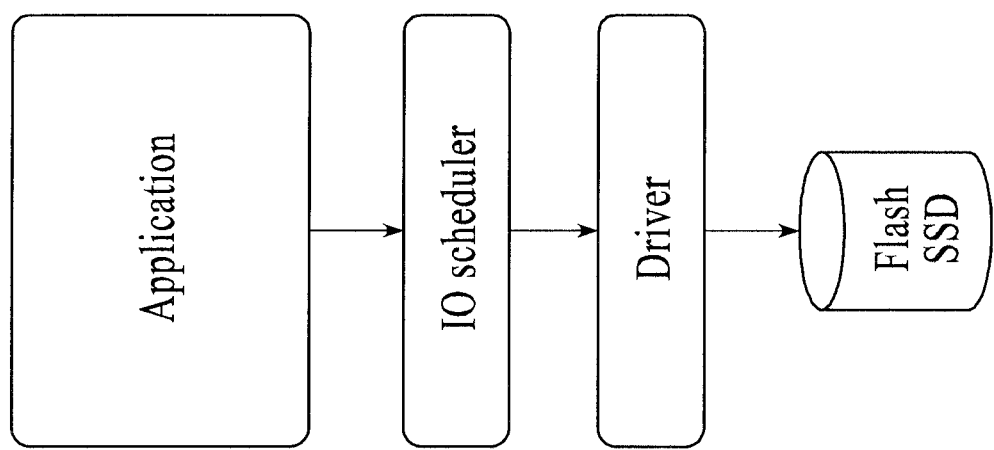
FIG. 2 illustrates an overview of the application layer that issues read and write commands to a solid state memory device.

FIG. 2 illustrates an overview of the application that typically resides in the system memory, such as 116-1 of FIG. 1, that typically executes on a CPU, such CPU 112 of FIG. 1, and which contains an IO scheduler that typically resides in a RAID controller, such as the RAID controller 114 of FIG. 1, to thereby issue read and write commands to a solid state memory device such as SSD memory 116-2 from FIG. 1.

With respect to SSD memory 116-2, reads and write commands are typically issued by an application (in user-mode) or by the operating system's kernel on behalf of the application. In contrast to conventional IO scheduling schemes that typically issue write commands to an SSD memory such as 116-2 immediately upon receiving the request from the application layer, the write scheduling scheme described herein does not perform writes at and when they are received from the application layer. Instead, the write scheduling scheme accumulates write requests for a period of time, such as between ~1 ms to ~30 ms, with a preferable period of time being about ~10-20 ms, such as reading each request into a DRAM buffer memory 116-1, and then issues them back to back into the SSD memory 116-2 in a burst, by writing them out of the DRAM buffer memory 116-1 in a back to back manner. Using the same example of a storage application writing at ~200 MB/s with 128 KB block size provided in the background, the proposed scheduling scheme accumulates a maximum of 32 writes for ~20 ms and issues them back to back, such that with a back to back write the 32 writes are typically executed within a burst of about 2-4 ms.

The advantage of scheduling writes in this manner shows up in the observed maximum sustained read bandwidth. In particular, an increase in available read bandwidth from flash based SSDs by ~50% simultaneously sustaining the write bandwidth at the same level. 50% increase in read bandwidth significantly improves storage application performance.

Figure 3:
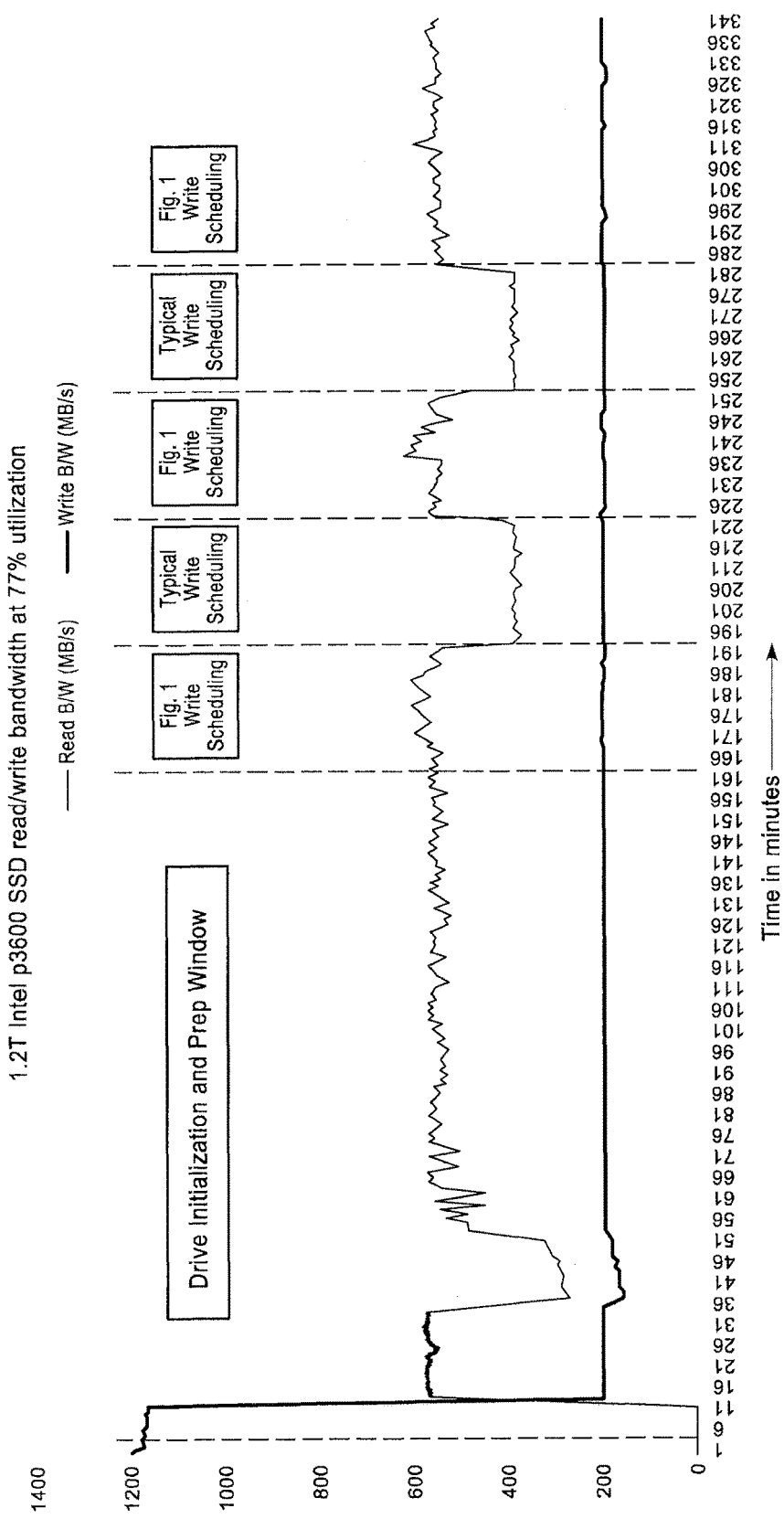
FIG. 3 compares the conventional write scheduling scheme with the described write scheduling scheme.

The plot provided in FIG. 3 compares the conventional write scheduling scheme with the described write scheduling scheme, interleaving the two, such that windows of time for a conventional write scheduling scheme and according to the embodiments herein as shown. The observed sustained read bandwidth, when using the described scheme, jumped from ~390 MB/s to ~580 MB/s (a ~50% increase).

In addition, the features described herein can be used with the features that are described in U.S. patent application Ser. No. 15/159,654 entitled "Endurance Aware Raid Scheme For Flash Based SSDs With FPGA Optimized Implementation" filed on the same day as this application, which is expressly incorporated by reference herein.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures.

What is claimed is:

1. A method of increasing read performance in a solid state device for a mixed read-write workload, while maintaining the write bandwidth, the method comprising the steps of:

performing a plurality of write operations into the solid state device over a predetermined window of time, the plurality of write operations being scheduled in a strictly time-based manner and being performed in a plurality of bursts, such that a first plurality of write operations are obtained from an accumulation of write requests for a predetermined preceding period of time that is set between 1 ms and 30 ms immediately prior to a first burst, and at least a second plurality of write operations are obtained from an accumulation of write requests for a predetermined subsequent period of time that is set between 1 ms and 30 ms immediately after the first burst; and performing a plurality of read operations from the solid state device during the predetermined window of time, wherein read bandwidth is increased due to the write operations being performed in the bursts within the predetermined window of time.

2. The method according to claim 1 wherein the accumulation of write request temporarily stores data associated with each write request in a buffer memory.

3. The method according to claim 1, wherein the predetermined period of time is between 10 ms and 20 ms.

4. The method according to claim 3 wherein the burst occurs within about 2-4 ms.

5. The method according to claim 1, wherein the step of performing the plurality of write operations is repeated for sequential periods during the window of time, each step of performing the plurality of write operations following the burst from a preceding plurality of write operations.

6. The method of claim 1, wherein the solid state device is based on flash media.

7. The method of claim 1, wherein an application issues read and write commands that are received as input to a scheduling program in an application layer that manages the accumulation of write requests and interacts with the solid state device to control temporal distribution of the plurality of write operations and read operations.

8. The method of claim 7, wherein the application resides in system memory.

9. The method of claim 7, wherein the application issues read and write commands in user mode.

10. The method of claim 7, wherein the application issues read and write commands using an operating system's kernel.

11. The method of claim 7, wherein the scheduling program accumulates up to 32 write requests before allowing write operations to be performed.

12. The method of claim 11, wherein once allowed, the write operations for the accumulated write requests are performed back to back within a burst.

13. The method of claim 1, wherein scheduling of the plurality of write operations is performed in a strictly time-based manner irrespective of a capacity of the solid state device in order to increase read performance.

* * * * *